(12) United States Patent
Muth et al.

(10) Patent No.: US 10,824,583 B2
(45) Date of Patent: Nov. 3, 2020

(54) BUS DEVICE AND METHOD FOR OPERATING A BUS DEVICE

(71) Applicant: NXP B.V., Eindhoven (NL)

(72) Inventors: Matthias Berthold Muth, Stelle (DE); Bernd Uwe Gerhard Elend, Hamburg (DE); Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/775,170

(22) Filed: Jan. 28, 2020

(65) Prior Publication Data

US 2020/0250127 A1 Aug. 6, 2020

(30) Foreign Application Priority Data

Jan. 31, 2019 (EP) .................................... 19154913

(51) Int. Cl.
*G06F 13/42* (2006.01)
*H03K 5/1534* (2006.01)
(Continued)

(52) U.S. Cl.
CPC ....... *G06F 13/4282* (2013.01); *H03K 5/1534* (2013.01); *H03M 5/12* (2013.01);
(Continued)

(58) Field of Classification Search
CPC ............. G06F 13/4282; H04L 12/4013; H04L 25/4906; H04L 2012/40215; H03M 5/12; H04B 1/38; H03K 5/1534
See application file for complete search history.

(56) References Cited

U.S. PATENT DOCUMENTS 8,593,202 B2 11/2013 Mori et al.
9,178,764 B2 11/2015 Hartwich et al.
(Continued)

FOREIGN PATENT DOCUMENTS

EP 2 661 032 A2 6/2013
EP 2 712 123 A1 3/2014
(Continued)

OTHER PUBLICATIONS

Lennartsson, K. et al. "CAN FD filter for Classical CAN controllers", iCC2015 CAN in Automation, 8 pgs., retreived from the internet May 21, 2020 at: URL:https://www.can-cia.org/fileadmin/resources/documents/proceedings/2015lennartsson.pdf(Oct. 31, 2015).

*Primary Examiner* — Henry Tsai
*Assistant Examiner* — Christopher A Daley
(74) *Attorney, Agent, or Firm* — Rajeev Madnawat

(57) ABSTRACT

The present disclosure relates to a bus device and a corresponding bus system. Furthermore, the present disclosure relates to a corresponding method of operating a bus device. In accordance with a first aspect of the present disclosure there is provided a bus device comprising a bus protocol controller with a transmit data output and a bus transceiver with a transmit data input coupled to the transmit data output of the bus protocol controller, wherein the bus protocol controller is configured to provide a serial bit stream designated for transmission through a bus via the transmit data output of the bus controller and via the transmit data input to the bus transceiver and to provide a switching signal within the serial bit stream, and wherein the bus transceiver is configured to switch between different operating modes in response to the switching signal.

14 Claims, 6 Drawing Sheets

(51) Int. Cl.
   *H03M 5/12*   (2006.01)
   *H04B 1/38*   (2015.01)
   *H04L 12/40*  (2006.01)
   *H04L 25/49*  (2006.01)
(52) U.S. Cl.
   CPC ........... *H04B 1/38* (2013.01); *H04L 12/4013* (2013.01); *H04L 25/4906* (2013.01); *H04L 2012/40215* (2013.01)

(56) References Cited

U.S. PATENT DOCUMENTS

| | | | |
|---|---|---|---|
| 2008/0151939 A1* | 6/2008 | Huber | H04L 25/4904 370/498 |
| 2012/0233341 A1* | 9/2012 | Mach | H04L 25/0262 709/228 |
| 2013/0290580 A1* | 10/2013 | Hartwich | H04L 12/4013 710/105 |
| 2014/0156893 A1 | 6/2014 | Monroe et al. | |
| 2015/0085411 A1* | 3/2015 | Yang | H04L 43/08 361/57 |
| 2016/0286010 A1 | 9/2016 | Lennartsson | |
| 2017/0163366 A1* | 6/2017 | Aichriedler | H04J 3/0658 |
| 2017/0257140 A1 | 9/2017 | de Hass et al. | |
| 2017/0262394 A1 | 9/2017 | de Hass et al. | |
| 2018/0041361 A1 | 2/2018 | Kishigami et al. | |
| 2018/0260353 A1 | 9/2018 | de Hass et al. | |
| 2018/0331853 A1* | 11/2018 | Fredriksson | G06F 13/42 |
| 2019/0058614 A1 | 2/2019 | de Hass et al. | |
| 2019/0296938 A1 | 9/2019 | van de Burgt et al. | |

FOREIGN PATENT DOCUMENTS

| | | |
|---|---|---|
| EP | 2 800 313 A1 | 5/2014 |
| WO | 2015011515 A1 | 1/2015 |

* cited by examiner

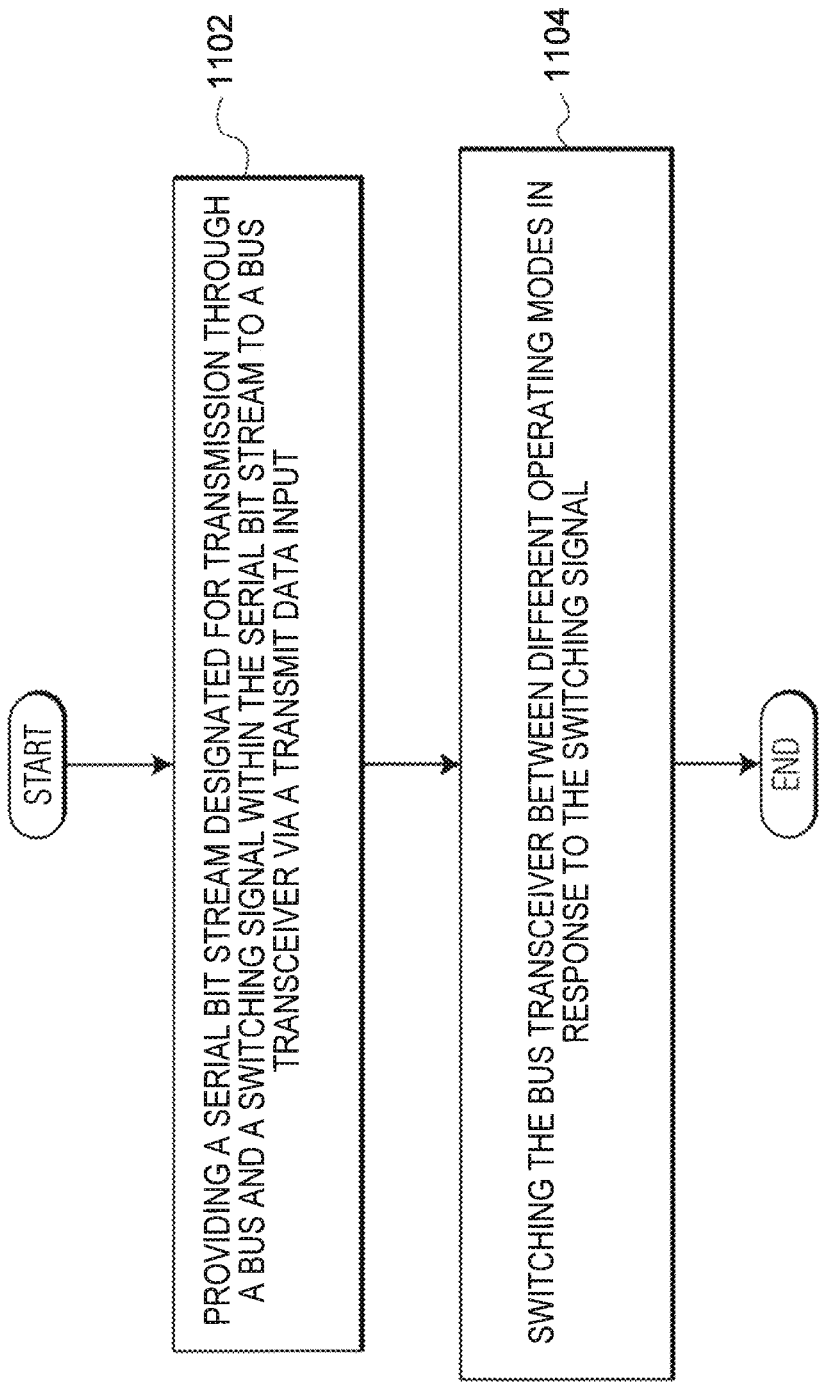

BUS DEVICE AND METHOD FOR OPERATING A BUS DEVICE

CROSS-REFERENCE TO RELATED APPLICATIONS

This application claims the priority under 35 U.S.C. § 119 of European patent application no. 19154913.8, filed on Jan. 31, 2019, the contents of which are incorporated by reference herein.

TECHNICAL FIELD

The present disclosure relates to a bus device and a corresponding bus system. Furthermore, the present disclosure relates to a corresponding method of operating a bus device.

BACKGROUND

In-vehicle network (IVN) busses, such as CAN (Controller Area Network), CAN FD (CAN with Flexible Data-Rate), LIN (Local Interconnect Network), FlexRay, Ethernet based network busses, and other types, can be used for communications within vehicles. For example, controller area network (CAN) bus is a message-based communications bus protocol that is often used within automobiles. A CAN bus network may include multiple bus devices, so called nodes or electronic control units (ECUs), such as an engine control module (ECM), a power train control module (PCM), airbags, antilock brakes, cruise control, electric power steering, audio systems, windows, doors, mirror adjustment, battery and recharging systems for hybrid/electric cars, and many more. The CAN bus protocol is used to enable communications between the various bus devices. The data link layer of the CAN protocol is standardized as International Standards Organization (ISO) 11898-1:2003. CAN Flexible Data-Rate or "CAN FD," which is an extension of the standardized CAN data link layer protocol and is meanwhile integrated into the ISO 11898-1:2015 standard, can provide higher data rates. However, it is of continuous interest to increase the data rates supported by an IVN, thus improving the communication speed between the bus devices.

SUMMARY

In accordance with a first aspect of the present disclosure there is provided a bus device comprising a bus protocol controller with a transmit data output and a bus transceiver with a transmit data input coupled to the transmit data output of the bus protocol controller, wherein the bus protocol controller is configured to provide a serial bit stream designated for transmission through a bus via the transmit data output of the bus controller and via the transmit data input to the bus transceiver and to provide a switching signal within the serial bit stream, and wherein the bus transceiver is configured to switch between different operating modes in response to the switching signal.

In one or more embodiments, the bus may be a CAN bus.

In one or more embodiments, the switching signal may comprise at least one of a change of the bit coding scheme and a change of the bit rate of the serial bit stream, and the bus protocol controller may be configured to provide at least one of different bit coding schemes and different bit rates of the serial bit stream corresponding with the different operating modes.

In one or more embodiments, the bus protocol controller may be configured to provide a slow bit coding scheme and a fast bit coding scheme, wherein the fast bit coding scheme may comprise more edges per time then the slow bit coding scheme.

In one or more embodiments, the operating modes may comprise a transmission mode with a lower transmission rate and a transmission mode with a higher transmission rate, and the bus protocol controller may be configured to provide the slow bit coding scheme during the transmission mode with a lower data transmission rate and to provide the fast bit coding scheme during the transmission mode with a higher data transmission rate.

In one or more embodiments, the bus protocol controller may be configured to provide NRZ bit coding as the slow bit coding scheme and at least one of Manchester bit coding and differential Manchester bit coding as the fast bit coding scheme.

In one or more embodiments, the operating modes may comprise an arbitration mode and a data mode, and the bus protocol controller may be configured to provide NRZ bit coding during the arbitration mode, and the at least one of Manchester bit coding and differential Manchester bit coding during the data mode.

In one or more embodiments, the switching signal may comprise a specific signal pattern with signal edges, and the bus protocol controller may be configured to provide the specific signal pattern.

In one or more embodiments, the operating modes may comprise a transmission mode with a lower transmission rate and a transmission mode with a higher transmission rate, and the specific signal pattern may comprise at least one of a fast sequence of signal edges, wherein the period between two signal edges of the specific signal pattern is less than the shortest period between two edges of the serial bit stream during the transmission mode with a lower transmission rate, a slow sequence of signal edges, wherein the period between two signal edges of the specific signal pattern is longer than the longest period between two edges of the serial bit stream during the transmission mode with a higher transmission rate, and a pre-defined sequence of signal edges.

In one or more embodiments, the bus transceiver may comprise a detector coupled to the transmit data input of the bus transceiver and configured to detect the switching signal within the serial bit stream and to activate switching between the different operating modes in response to the switching signal.

In one or more embodiments, the bus transceiver may comprise at least one of a transmitter, a receiver and a power control, and the detector may be coupled to the at least one of the transmitter, the receiver and the power control and configured to activate switching between different operating modes of the at least one of the transmitter, the receiver and the power control in response to the switching signal.

In one or more embodiments, the bus protocol controller may be configured to provide a plurality of switching signals within the serial bit stream, each switching signal being related to at least one of the transmitter, the receiver and the power control, and the detector may be configured to activate switching between different operating modes of the at least one of the transmitter, the receiver and the power control in response to at least one of the switching signals.

In one or more embodiments, the bus transceiver may comprise at least two detectors, and each detector may be coupled to at least one of the transmitter, the receiver and the power control and configured to activate switching between different operating modes of at least one of the transmitter, the receiver and the power control in response to at least one of the switching signals.

In accordance with a second aspect of the present disclosure there is provided a bus system comprising a plurality of bus devices coupled to communicate via a bus.

In accordance with a third aspect of the present disclosure there is provided a method of operating a bus device, the method may comprise: providing a serial bit stream designated for transmission through a bus via a transmit data input to a bus transceiver, and providing a switching signal within the serial bit stream, and switching the bus transceiver between different operating modes in response to the switching signal.

The above discussion is not intended to represent every example embodiment or every implementation within the scope of the Claims. The Figures and Detailed Description that follow also exemplify various example embodiments.

BRIEF DESCRIPTION OF THE DRAWINGS

One or more embodiments will be described in more detail by way of example only with reference to the appended drawings, in which:

FIG. 11 shows an exemplary process flow diagram of a method of operating a bus device according to an embodiment.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

Techniques described herein can be applied to any type of in-vehicle network (IVN) busses, including CAN (Controller Area Network), CAN FD (CAN with Flexible Data-Rate). LIN (Local Interconnect Network), FlexRay. Ethernet based network busses, and other types. Although in some embodiments a specific type of IVN is described, it should be noted that the invention is not restricted to a specific type of IVN.

Figure 1:
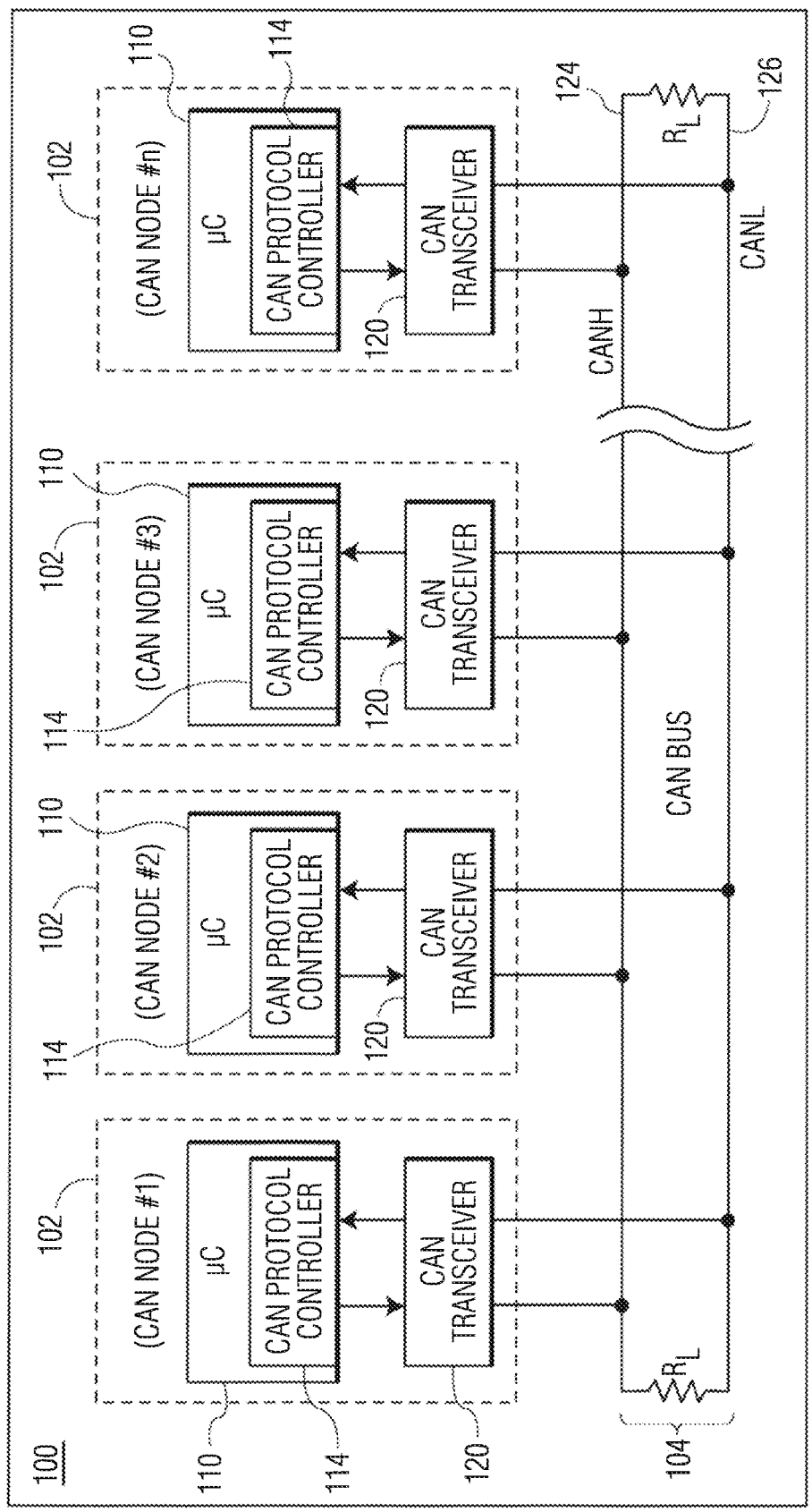
FIG. 1 shows an example of a CAN bus network with multiple nodes.

FIG. 1 shows an example of a bus system 100 with a plurality of bus devices 102 coupled to communicate via a bus 104. FIG. 1 depicts an example of a CAN network 100 that includes multiple CAN nodes 102, also referred to as "ECUs" or CAN bus devices, each connected to a CAN bus 104. In this example, each CAN node includes a microcontroller 110 having an embedded CAN protocol controller 114 and a CAN transceiver 120. The microcontrollers are typically connected to at least one device (not shown) such as a sensor, an actuator, or some other control device and are programmed to determine the meaning of received messages and to generate appropriate outgoing messages. The microcontrollers, also referred to as host processors, hosts, or digital signal processors (DSPs), are known in the field. In an example, the host supports application software that interacts with the CAN protocol controller.

The CAN protocol controllers 114, which can be embedded within the microcontrollers 110 or external to the microcontrollers (e.g., a separate IC device), implement data link layer operations as is known in the field. For example, in receive operations, a CAN protocol controller stores received serial bits from the transceiver until an entire message is available for fetching by the microcontroller. The CAN protocol controller can also decode the CAN messages according to the standardized frame format of the CAN protocol. In transmit operations, the CAN protocol controller receives messages from the microcontroller and transmits the messages as serial bits in the CAN frame format to the CAN transceiver.

The CAN transceivers 120 are located between the microcontrollers 110 and the CAN bus 104 and implement physical layer operations. For example, in receive operations, a CAN transceiver converts analog differential signals from the CAN bus to serial digital signals that the CAN protocol controller 114 can interpret. The CAN transceiver also protects the CAN protocol controller from extreme electrical conditions on the CAN bus, e.g., electrical surges. In transmit operations, the CAN transceiver converts serial digital bits received from the CAN protocol controller into analog differential signals that are sent on the CAN bus.

The CAN bus 104 carries analog differential signals and includes a CAN high (CANH) bus line 124 and a CAN low (CANL) bus line 126. The CAN bus is known in the field.

Figure 2:
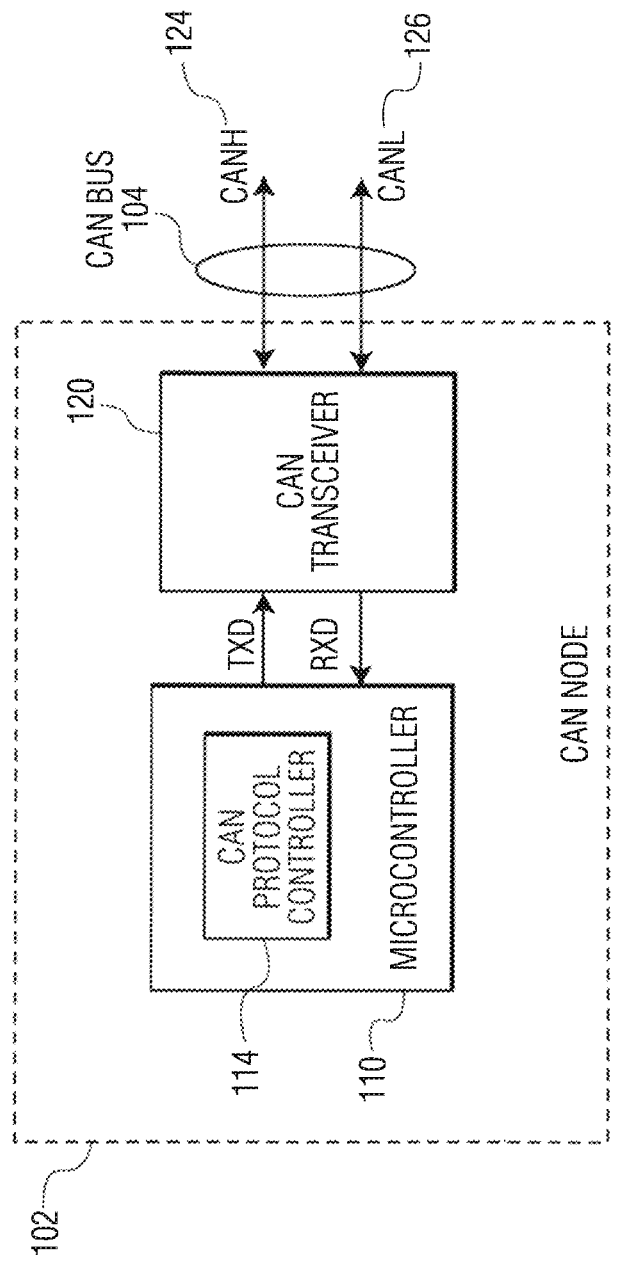
FIG. 2 shows an example of a node from FIG. 1.

FIG. 2 depicts an example of a node 102 from FIG. 1. Same reference signs indicate same elements. As illustrated in FIG. 2, data communicated from the microcontroller to the CAN transceiver is identified as transmit data (TXD) and data communicated from the CAN transceiver to the microcontroller is referred to as receive data (RXD). Throughout the description, TXD is carried on a TXD path and RXD is carried on an RXD path. Data is communicated to and from the CAN bus via the CANH and CANL bus lines 124 and 126, respectively.

Figure 3:
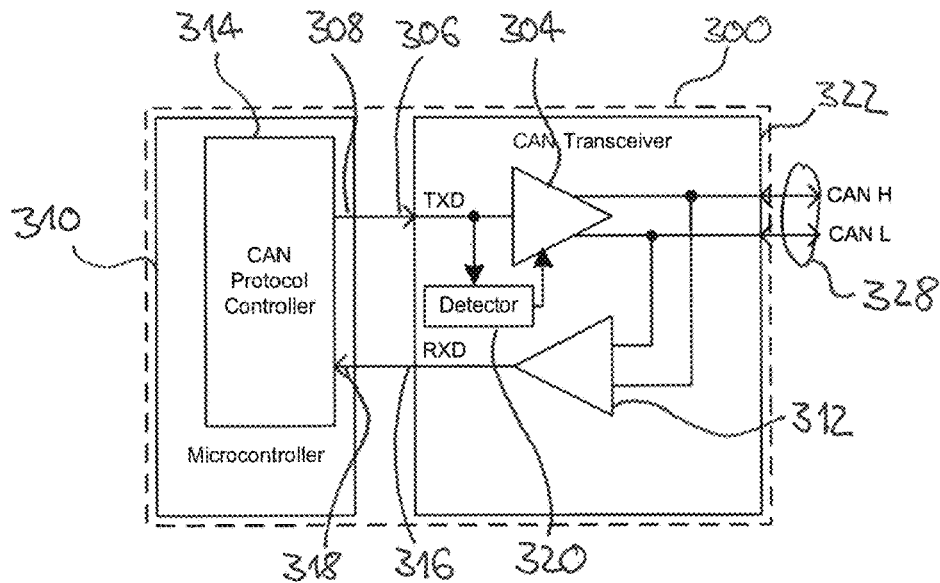
FIGS. 3 to 5 show schematic diagrams of examples of bus devices according to embodiments.
Figure 4:
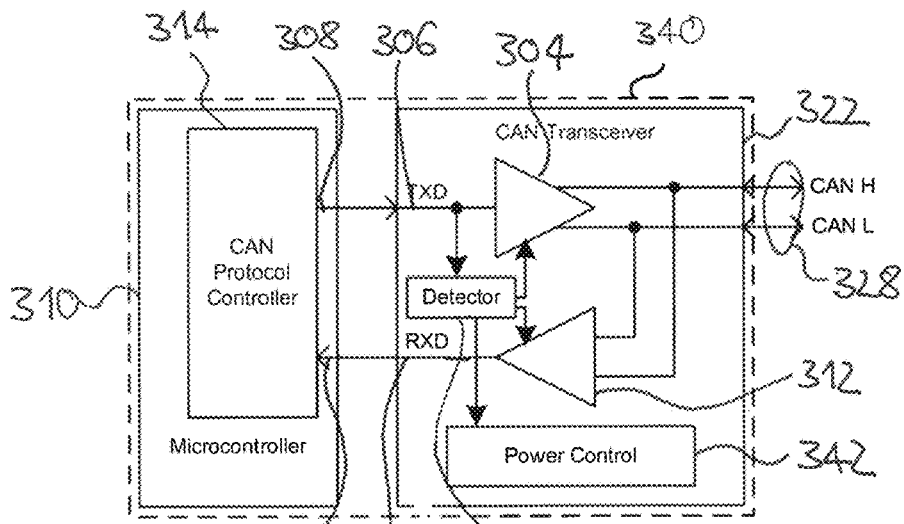
Figure 5:
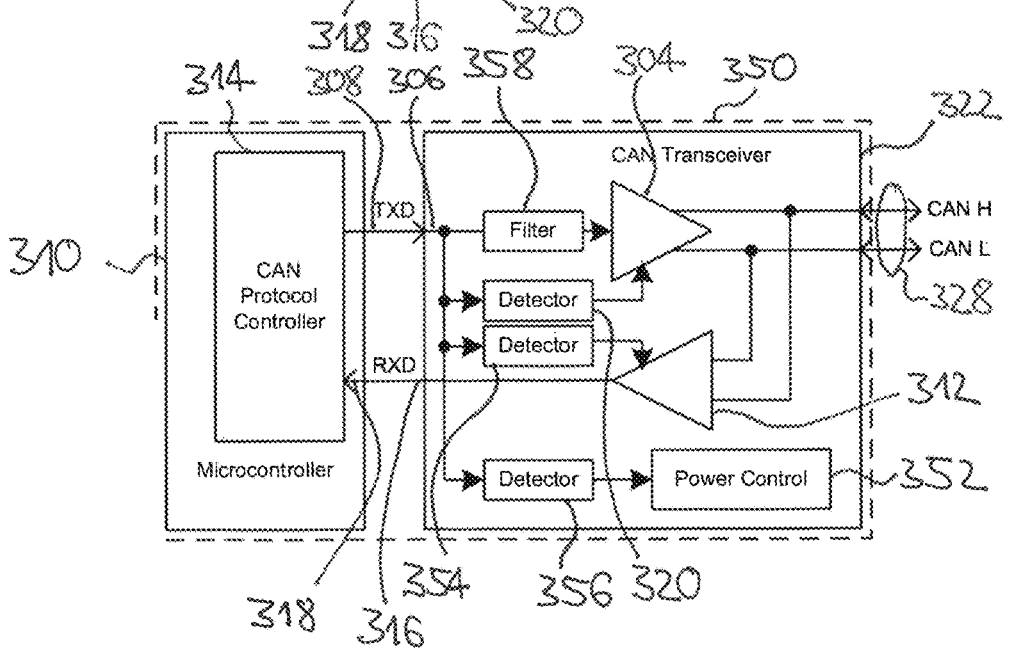

FIGS. 3 to 5 show schematic diagrams of examples of bus devices 300, 340, 350, according to embodiments. Same reference signs indicate same elements. The bus device depicted in FIGS. 3 to 5 may be embodiments of the CAN node 102 depicted in FIGS. 1 and 2. However, the CAN node 102 depicted in FIGS. 1 and 2 is not limited to the embodiments shown in FIGS. 3 to 5.

The bus devices 300, 340, 350 may be CAN devices. CAN is used as a generic term herein, comprising a plurality of different CAN types like, for example, classic CAN and CAN FD, which are described in the CAN bus standard ISO 11898.

Although the illustrated bus devices are shown with certain components and described with certain functionality herein, other embodiments of the bus device may include fewer or more components to implement the same, less, or more functionality.

FIG. 3 shows a bus device 300. The bus device 300 comprises a bus protocol controller 314 with a transmit data output 308 and a bus transceiver 322 with a transmit data input 306 coupled to the transmit data output 308 of the bus protocol controller 314. The bus transceiver 322 comprises a transmitter 304 coupled to the transmit data input 306 of the bus transceiver 322 and coupled to a bus 328.

The bus protocol controller 314 may form part of a microcontroller 310. The bus protocol controller 314 comprises a receive data input 318 coupled to a receive data output 316 of the bus transceiver 322. The bus transceiver 322 comprises a receiver 312 coupled to the receive data output 316 of the bus transceiver 322 and to the bus 328.

The bus protocol controller 314 is configured to provide a serial bit stream via the transmit data output 308 of the bus controller 314 and via the transmit data input 306 to the bus transceiver 322. The bus protocol controller 314 is further configured to provide a switching signal within the serial bit stream. The serial bit stream is designated for transmission through the bus 328. The bus transceiver 322 is configured to switch between different operating modes in response to the switching signal.

The operating modes refer to a behavior of the transceiver 322. The operating mode may be, for example, a transmission mode of the bus transceiver 322, for example, the driver characteristics of the transmitter 304. The operating modes may comprise a transmission mode with a lower transmission rate and a transmission mode with a higher transmission rate. The bus transceiver 322 may be configured to switch between different transmission modes.

The transmission mode may be specified by at least one of level, bit polarity, driver strength, signal slope, impedance, and other driver defining characteristics of the output drivers to the bus.

By "hiding" switching information detectable by the transceiver within the serial bit stream of the bus protocol an integrated mode control of the transceiver is provided. With the integrated transmission performance change increased data rates are supported by the bus and the communication speed between the bus devices is improved compared with known bus concepts.

Besides, as bus systems with high speeds require transceivers with different driver characteristics depending on the phase in the communication protocol a dedicated extra control signal between the protocol controller and the bus transceiver is required. An extra pin on the transceiver side and the microcontroller side has been needed. The present disclosure allows to avoid that extra connection and with that, saves cost and allows pin compatible solutions with older devices. Additionally, the standard number of interface lines between the bus protocol controller and the transceiver may be reduced in the same way by replacing extra lines for other control functions, like the Low Power Mode Control function (e.g. Standby Control Line), and others.

The bus protocol controller may be configured to provide a switching signal, which is, for example, superimposed on the serial bit stream or embedded in the serial bit stream.

The bus protocol controller may be configured to provide a plurality of switching signals, for example referring to different operating modes, e.g. a first switching signal or a group of first switching signals refers to a first operating mode and a second switching signal or a group of second switching signals refers to a second operating mode.

The bus protocol controller may be configured to provide at least one of different bit coding schemes, different bit rates and a specific signal pattern, so that the frequency of edges in the serial bit stream changes.

The bus protocol controller may be configured to provide a slow bit coding scheme, for example NRZ (Non-Return to Zero) bit coding, and a fast bit coding scheme, for example at least one of Manchester bit coding and differential Manchester bit coding, wherein the fast bit coding scheme comprises more edges per time then the slow bit coding scheme. An example of a change of a bit rate is the change between NRZ slow bit coding and NRZ fast bit coding.

The bus protocol controller may be configured to provide the slow bit coding scheme during a transmission mode with a lower data transmission rate, in particular during an arbitration mode, and to provide the fast bit coding scheme during a transmission mode with a higher data transmission rate, in particular during a data mode.

The bus transceiver 322 may comprise a detector 320 coupled to the transmit data input 306 of the bus transceiver 322. Further, the detector 320 may be coupled to the transmitter 304.

The detector may comprise, for example, at least one of a timer, a counter, a filter, a state machine, a sampler, and a memory.

The detector may be configured to detect the switching signal within the serial bit stream and to activate switching between the different operating modes in response to the switching signal.

The detector may be configured to detect a switching signal, which is, for example, superimposed on the serial bit stream or embedded in the serial bit stream.

The detector may be configured to detect a plurality of switching signals provided by the bus protocol controller.

The detector may be configured to detect at least one of different bit coding schemes, different bit rates and a specific signal pattern, as provided by the bus protocol controller. For example, the detector may be configured to detect a change between NRZ bit coding and Manchester bit coding or differential Manchester bit coding, or a change between NRZ slow bit coding and NRZ fast bit coding.

The detector may be configured to detect a sequence of edges in the serial bit stream or a change within a sequence of edges, for example, by the number of edges on the bit stream within a period of time or by the period of time between the edges.

The detector may be configured to activate switching between transmission modes of the bus transceiver, for example, between driver characteristics of the transmitter 304.

The detector may be configured to activate switching between a transmission mode with a lower data transmission rate, in particular an arbitration mode, and a transmission mode with a higher data transmission rate, in particular a data mode.

FIG. 4 shows a bus device 340. The bus device 340 comprises the components and functionality of the bus device 300 of FIG. 3. In addition, the transceiver 322 of the bus device 340 comprises a power control 342. In FIG. 4, the detector 320 is coupled to the receiver 312 and to the power control 342. In other examples, the detector 320 may be coupled to the receiver 312 only or to the power control 342 only.

The detector 320 may be configured to activate switching between different operating modes of at least one of the transmitter 304, the receiver 312 and the power control 342 in response to the switching signal.

The detector 320 may be configured to detect a plurality of switching signals within the serial bit stream, each switching signal or group of switching signals being related to at least one of the transmitter, the receiver and the power control, and the detector may be configured to activate switching between different operating modes of the at least one of the transmitter, the receiver and the power control in response to at least one of the switching signals. For example, the detector 320 may be configured to activate switching of the power control between active mode and low power mode in response to a specific switching signal.

FIG. 5 shows a bus device 350. The bus device 350 comprises the components and functionality of the bus device 300 of FIG. 3. In addition, the transceiver 322 of the bus device 350 comprises a power control 352, a second detector 354 and a third detector 356. In FIG. 5, the second detector 354 is coupled to the receiver 312 and the third detector 356 is coupled to the power control 352.

The second detector 354 may be configured to activate switching between different operating modes of the receiver 312 in response to a switching signal.

The third detector 356 may be configured to activate switching between different operating modes of the power control 352 in response to a switching signal.

In some embodiments, the bus transceiver 322 may also comprise a filter 358 arranged within the transmit data input line 306 in parallel to the detector 320.

In some examples, the filter may be a short pulse filter, for example a low pass filter, preventing transmission of short pulses to the bus.

In some examples, the filter may be a mask filter preventing transmission of signals to the bus during a defined period of time which is less than the nominal bit length. The mask filter may comprise a timer and a memory.

FIGS. 6 to 10 show exemplary time diagrams of bit streams 600, 700, 800, 900, 1000 with switching signals 610, 620, 710, 720, 820, 910, 1010, 1020 according to embodiments. Same reference signs indicate same elements. The bit streams depicted in FIG. 6 to 10 may be embodiments of the serial bit stream provided by the bus protocol controller 314 depicted in FIG. 3 to 5. However, the serial bit streams provided by the bus protocol controller 314 depicted in FIG. 3 to 5 is not limited to the embodiments of the serial bit streams shown in FIGS. 6 to 10.

The switching signals may be, for example, superimposed on the serial bit stream or embedded in the serial bit stream. The switching signal may be one of a plurality of switching signals, for example, referring to different operating modes, e.g. a first switching signal or a group of first switching signals referring to a first operating mode and a second switching signal or a group of second switching signals referring to a second operating mode.

The switching signal may be realized by a change of the bit coding scheme of the serial bit stream or a change of the bit rate of the serial bit stream or a specific signal pattern within the serial bit stream, or a combination of at least two of those, so that the frequency of edges in the serial bit stream changes.

Figure 6:
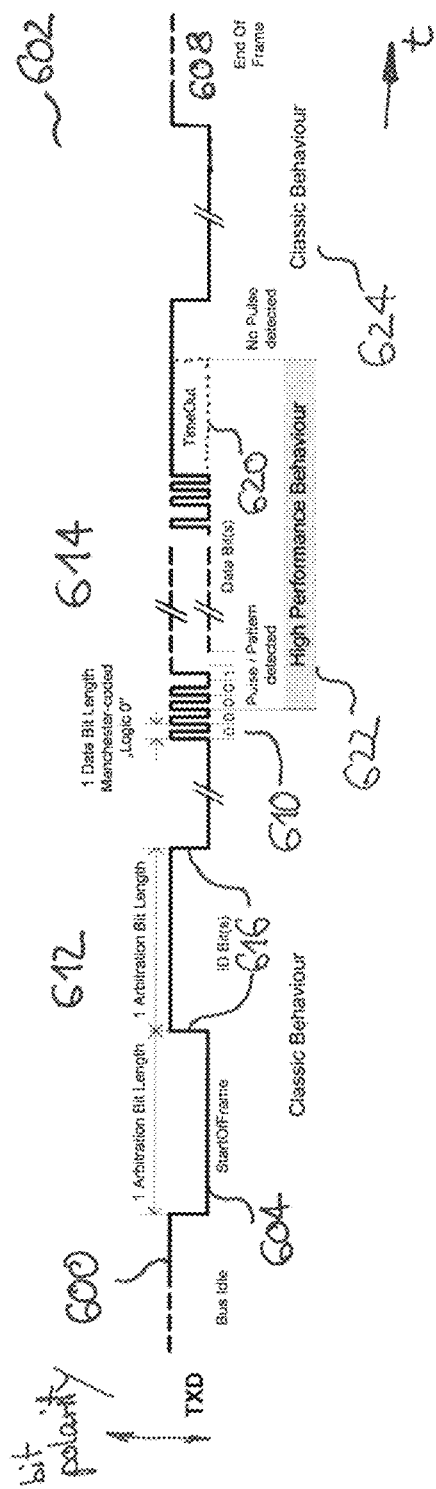
FIGS. 6 to 10 show exemplary time diagrams of bit streams with switching signals according to embodiments and corresponding to at least one of the bus devices depicted in FIGS. 3 to 5.

FIG. 6 shows an example of a bit stream 600, wherein the switching signal 610, 620 is realized by a change of the bit coding scheme of the serial bit stream.

The serial bit stream 600 comprises a frame 602 extending from a first bit 604 to the end of frame 608. The frame 602 comprises an arbitration mode 612 coded with a slow bit coding scheme, for example with NRZ coding, and a data mode 614, coded with a fast bit coding scheme, for example Manchester coding or Differential Manchester coding. The fast bit coding scheme comprises more edges 616 per time then the slow bit coding scheme. The serial bit stream 600 comprises a first switching signal 610 at the change from the slow bit coding scheme to the fast bit coding scheme with a fast sequence of edges 616, wherein the period between two edges 616 is less than the shortest period between two edges 616 during the arbitration mode 612 with slow bit coding scheme. The serial bit stream 600 further comprises a second switching signal 620 at the change from the fast bit coding scheme to the slow bit coding scheme with a slow sequence of edges 616, wherein the period between two edges 616 is longer than the longest period between two edges 616 during the data mode with fast bit coding scheme.

In response to the first switching signal 610 a high performance behavior 622 of the transceiver is activated. In response to the second switching signal 620 a classical behavior 624 of the transceiver is activated. The high performance behavior 622 corresponds to a transmission mode with a higher transmission rate, while the classical behavior 624 corresponds to a transmission mode with a lower transmission rate.

NRZ coding is backwards compatible with known CAN concepts.

Manchester coding is standardized for example in IEEE 802.3. With Manchester coding there are no phases without signal change, thus Manchester coding provides permanently signal edges. The signal edges on the bus lines can be used for re-synchronization—receiving node(s) can be synchronized on the data stream (self-clocking) without the need of stuff bits, which increases the net bandwidth.

Differential Manchester coding is standardized for example in IEEE 802.5. Differential Manchester code is free of any signal polarity, which might be interesting for systems using a medium, where the polarity may accidentally be swapped.

In addition to the change between different coding schemes, the switching signal may comprise a specific signal pattern. The specific signal pattern comprises at least one of a fast sequence of signal edges, wherein the period between two signal edges of the specific signal pattern is less than the shortest period between two edges of the serial bit stream during the transmission mode with a lower transmission rate, a slow sequence of signal edges, wherein the period between two signal edges of the specific signal pattern is longer than the longest period between two edges of the serial bit stream during the transmission mode with a higher transmission rate, and a pre-defined sequence of signal edges.

Introducing the change of the bit coding schemes with a specific bit pattern, for example a pre-defined sequence of signal edges, may ensure, that the detection of a change between different bit coding schemes and corresponding switching between operation modes is not delayed, and may avoid that the receiving node(s) are running out of synchronization to the sending node.

FIGS. 7 to 10 show examples of bit streams 700, 800, 900, 1000, wherein switching signals 710, 720, 820, 910, 1010, 1020 comprise specific signal patterns.

A specific signal pattern may comprise at least one of a fast sequence of signal edges, wherein the period between two signal edges of the specific signal pattern is less than the shortest period between two edges of the serial bit stream during the transmission mode with a lower transmission rate, a slow sequence of signal edges, wherein the period between two signal edges of the specific signal pattern is longer than the longest period between two edges of the serial bit stream during the transmission mode with a higher transmission rate, and a pre-defined sequence of signal edges.

The fast sequences of signal edges may comprise, for example, short pulses. Very short bit lengths in the specific signal patterns would be hided intrinsically with old transceivers due to their speed limitation.

The slow sequences of signal edges comprise, for example, long periods without any signal edges.

The pre-defined sequences of signal edges, may be defined, for example, by at least one of a number of signal edges within a period of time and a period of time between the signal edges. One or more of those may vary within a pre-defined sequence of signal edges and between pre-defined sequences of signal edges.

Different switching signals within a serial bit stream may allow to activate switching between operating modes of different components.

Figure 7:
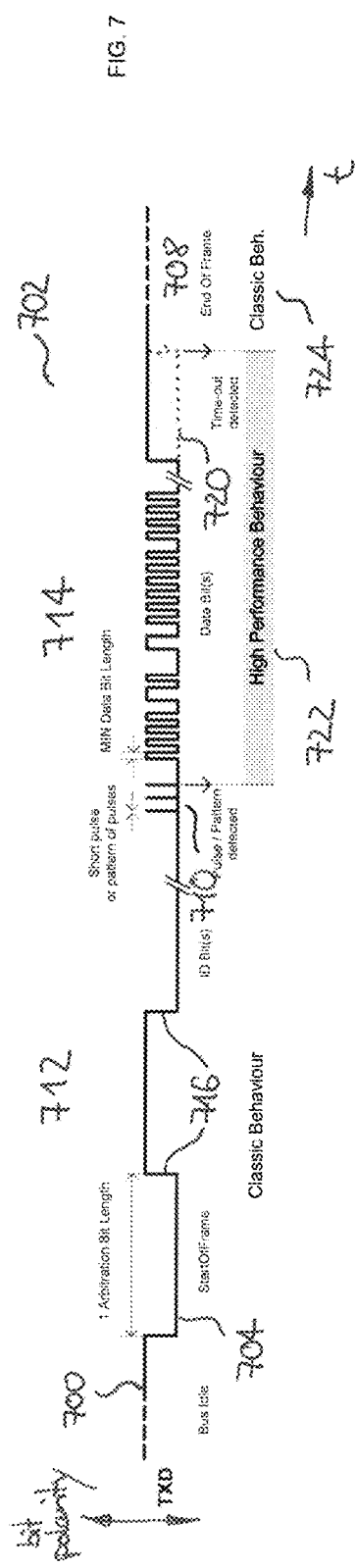

FIG. 7 shows an example of a bit stream 700, wherein switching signals 710, 720 are realized by specific signal patterns within the serial bit stream 700.

The serial bit stream 700 comprises a frame 702 extending from a first bit 704 to the end of frame 708. The frame 702 comprises an arbitration mode 712 and a data mode 714. The serial bit stream 700 comprises a first switching signal 710 with a fast sequence of edges 716, e.g. short pulses, wherein the period between two edges 716 is less than the shortest period between two edges 716 during the arbitration mode 712. The serial bit stream 700 further comprises a second switching signal 720 with a slow sequence of edges 716, wherein the period between two edges 716 is longer than the longest period between two edges 716 during the data mode.

In response to the first switching signal 710 a high performance behavior 722 of the transceiver is activated. In response to the second switching signal 720 a classical behavior 724 of the transceiver is activated. The high performance behavior 722 corresponds to a transmission mode with a higher transmission rate, while the classical behavior 724 corresponds to a transmission mode with a lower transmission rate.

In some examples, the switching signal may comprise a pre-defined sequence of signal edges, for example defined by at least one of the number of signal edges within a period of time and the period of time between the signal edges. One or more of those may vary within a pre-defined sequence of signal edges and between pre-defined sequences of signal edges.

Figure 8:
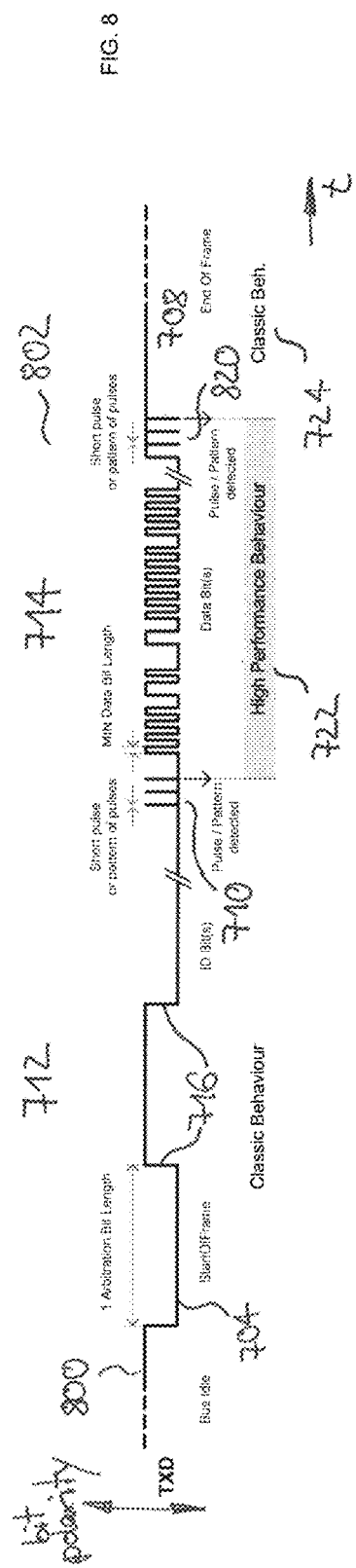

FIG. 8 shows an example of a bit stream 800, wherein switching signals 710, 820 are realized by specific signal patterns within the serial bit stream 800. The serial bit stream 800 differs from the serial bit stream 700 in that the serial bit stream 800 comprises a frame 802 comprising a second switching signal 820 with a fast sequence of edges 716, e.g. short pulses, wherein the period between two edges 716 is less than the shortest period between two edges 716 during the arbitration mode 712. In response to the second switching signal 820 a classical behavior 724 of the transceiver is activated.

Switching signals with a fast sequence of edges allow to increase the communication speed between within a bus.

In some examples, the switching signals 710 and 820 differ from each other, for example, the switching signals 710 and 820 may comprise different pre-defined sequences of signal edges, which may, for example, differ by at least one of the number of signal edges within a period of time and the period of time between the signal edges.

Figure 9:
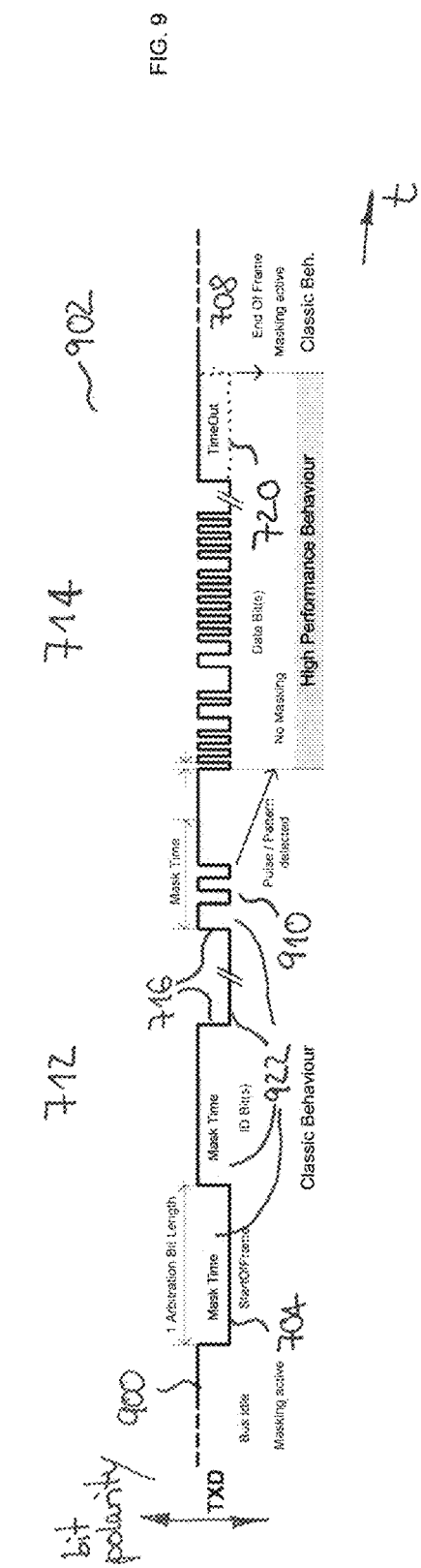

FIG. 9 shows an example of a bit stream 900, wherein switching signals 910, 720 are realized by specific signal patterns within the serial bit stream 900. The serial bit stream 900 differs from the serial bit stream 700 in that a mask time 922 is provided within the bits of the arbitration mode preventing transmission of signals within the mask time to the bus during a defined period of time which is less than the nominal bit length. The serial bit stream 900 comprises a frame 902 comprising a first switching signal 910, which is provided within the mask time 922 and is filtered from the transmission to the bus. In response to the first switching signal 910 a high performance behavior 722 of the transceiver is activated.

Masking out specific signal patterns allows to avoid that switching signals, which would disturb the communication in the bus, enter the bus. This allows more flexibility when defining switching signals and makes the transceivers very robust for specific signal patterns.

Figure 10:
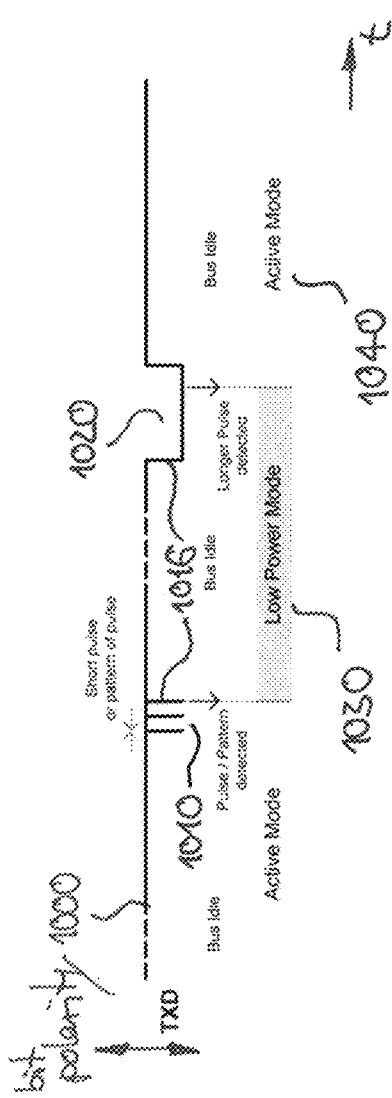

FIG. 10 shows an example of a bit stream 1000, wherein switching signals 1010, 1020 are realized by specific signal patterns within the serial bit stream 1000. In response to a first switching signal 1010 with a fast sequence of edges 1016, e.g. short pulses, a low power mode 1030 of the transceiver is activated. In response to a second switching signal 1020 with a slow sequence of edges 1016 an active mode is 1040 of the transceiver is activated.

FIG. 11 shows an exemplary process flow diagram of a method of operating a bus device according to an embodiment. The bus device may correspond to at least one of the bus devices depicted in FIGS. 3 to 5. The bit stream may correspond to at least one of the bit streams depicted in FIGS. 6 to 10.

At block 1102, a serial bit stream and a switching signal within the serial bit stream are provided via a transmit data input to a bus transceiver, where the serial bit stream is designated for transmission through a bus. At block 1104, in response to the switching signal the bus transceiver is switched between different operating modes.

Based on the same mechanisms as described herein above, phases for frame pre-emption may be realized. The pre-emption function shall allow very long data frames to be interrupted during sending by another node. Very long frames would block the bus for a rather long time for other nodes. This leads to quite long latency times if another high priority information needs to get access to the bus. In order to interrupt a sending node during the data field, a mechanism would be required, which stops the "high performance" drive characteristic from time to time, to give another node the chance to override the bus signal.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The skilled person will be able to design many alternative embodiments without departing from the scope of the appended claims.

In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A bus device comprising
  a bus protocol controller with a transmit data output and a bus transceiver with a transmit data input coupled to the transmit data output of the bus protocol controller,
  wherein the bus protocol controller is configured to provide a serial bit stream designated for transmission through a bus via the transmit data output of the bus controller and via the transmit data input to the bus transceiver and to provide a switching signal within the serial bit stream, and
  wherein the bus transceiver is configured to switch between different operating modes in response to the switching signal,
  wherein the bus transceiver comprises a detector coupled to the transmit data input of the bus transceiver and configured to detect the switching signal within the serial bit stream and to activate switching between the different operating modes in response to the switching signal.

2. A bus device according to claim 1, wherein the bus is a CAN bus.

3. The bus device according to claim 1, wherein the switching signal comprises at least one of a change of the bit coding scheme and a change of the bit rate of the serial bit stream and wherein the bus protocol controller is configured to provide at least one of different bit coding schemes and different bit rates of the serial bit stream corresponding with the different operating modes.

4. The bus device according to claim 3, wherein the bus protocol controller is configured to provide a slow bit coding scheme and a fast bit coding scheme, wherein the fast bit coding scheme comprises more edges per time then the slow bit coding scheme.

5. The bus device according to claim 4, wherein the operating modes comprise a transmission mode with a lower transmission rate and a transmission mode with a higher transmission rate, and wherein the bus protocol controller is configured to provide the slow bit coding scheme during the transmission mode with a lower data transmission rate and to provide the fast bit coding scheme during the transmission mode with a higher data transmission rate.

6. The bus device according to claim 4, wherein the bus protocol controller is configured to provide NRZ bit coding as the slow bit coding scheme and at least one of Manchester bit coding and differential Manchester bit coding as the fast bit coding scheme.

7. The bus device according to claim 4, wherein the operating modes comprise an arbitration mode and a data mode, and wherein the bus protocol controller is configured to provide NRZ bit coding during the arbitration mode, and the at least one of Manchester bit coding and differential Manchester bit coding during the data mode.

8. The bus device according to claim 1, wherein the switching signal comprises a specific signal pattern with signal edges and wherein the bus protocol controller is configured to provide the specific signal pattern.

9. The bus device according to claim 8, wherein the operating modes comprise a transmission mode with a lower transmission rate and a transmission mode with a higher transmission rate, and wherein the specific signal pattern comprises at least one of
  a fast sequence of signal edges, wherein the period between two signal edges of the specific signal pattern is less than the shortest period between two edges of the serial bit stream during the transmission mode with a lower transmission rate,
  a slow sequence of signal edges, wherein the period between two signal edges of the specific signal pattern is longer than the longest period between two edges of the serial bit stream during the transmission mode with a higher transmission rate, and
  a pre-defined sequence of signal edges.

10. The bus device according to claim 1, wherein the bus transceiver comprises at least one of a transmitter, a receiver and a power control, and wherein the detector is coupled to the at least one of the transmitter, the receiver and the power control and configured to activate switching between different operating modes of the at least one of the transmitter, the receiver and the power control in response to the switching signal.

11. The bus device according to claim 10, wherein the bus protocol controller is configured to provide a plurality of switching signals within the serial bit stream, each switching signal being related to at least one of the transmitter, the receiver and the power control, and wherein the detector is configured to activate switching between different operating modes of the at least one of the transmitter, the receiver and the power control in response to at least one of the switching signals.

12. The bus device according to claim 11, wherein the bus transceiver comprises at least two detectors, and wherein each detector is coupled to at least one of the transmitter, the receiver and the power control and configured to activate switching between different operating modes of at least one of the transmitter, the receiver and the power control in response to at least one of the switching signals.

13. A bus system comprising a plurality of bus devices according to claim 1, coupled to communicate via a bus.

14. Method of operating a bus device, the method comprising:
  providing a serial bit stream designated for transmission through a bus via a transmit data input to a bus transceiver, and
  providing a switching signal embedded in the serial bit stream, and
  switching the bus transceiver between different operating modes in response to the switching signal,
  wherein the switching includes using a detector coupled to the transmit data input of the bus transceiver to detect the switching signal within the serial bit stream and to activate switching between the different operating modes in response to the switching signal.

* * * * *